United States Patent [19]
Huang et al.

[11] Patent Number: 6,001,733
[45] Date of Patent: Dec. 14, 1999

[54] METHOD OF FORMING A DUAL DAMASCENE WITH DUMMY METAL LINES

[75] Inventors: Yimin Huang, Taichung Hsien; Ming-Sheng Yang, Hsinchu; Tri-Rung Yew, Hsinchu Hsien, all of Taiwan

[73] Assignee: United Microelectronics Corp., Hsinchu, Taiwan

[21] Appl. No.: 09/164,856

[22] Filed: Oct. 1, 1998

[30] Foreign Application Priority Data

Jun. 26, 1998 [TW] Taiwan ................................ 87110352

[51] Int. Cl.$^6$ .................................................. H01L 21/44
[52] U.S. Cl. .......................................... 438/633; 438/634
[58] Field of Search ..................... 438/633, 634, 438/637, 638, 620, 622

[56] References Cited

U.S. PATENT DOCUMENTS

| | | | |
|---|---|---|---|
| 4,789,648 | 12/1988 | Chow et al. | 437/225 |
| 5,578,523 | 11/1996 | Fiordalice et al. | 437/190 |
| 5,741,626 | 4/1998 | Jain et al. | 430/314 |
| 5,793,272 | 8/1996 | Burghartz et al. | |
| 5,801,094 | 9/1998 | Yew et al. | 438/624 |
| 5,801,095 | 9/1998 | Huang et al. | 438/627 |
| 5,884,990 | 8/1996 | Burghartz et al. | |

FOREIGN PATENT DOCUMENTS 10-098039  4/1998  Japan .

Primary Examiner—Charles Bowers
Assistant Examiner—Martin Sulsky
Attorney, Agent, or Firm—Jiawei Huang; J.C. Patents

[57] ABSTRACT

A method for forming dual damascene is provided. First, a first inter-metal dielectric layer and a stop layer is formed on a substrate, and then a first photoresist pattern including a via hole and a dummy metal line is patterned and the stop layer is etched for forming via hole. Next, a second inter-metal dielectric layer is deposited and then a second photoresist pattern is patterned for forming metal line trench by etching. Afterwards, a glue layer and a metal layer are blanketed and the dual damascene structure is formed by chemical mechanical polishing.

8 Claims, 9 Drawing Sheets

METHOD OF FORMING A DUAL DAMASCENE WITH DUMMY METAL LINES

CROSS-REFERENCE TO RELATED APPLICATION

This application claims the priority benefit of Taiwan application serial no. 87110352, filed Jun. 26, 1998, the full disclosure of which is incorporated herein by reference.

BACKGROUND OF THE INVENTION

1. Field of the Invention

This invention relates in general to a method for forming dual damascene, and more specifically relates to a method for forming dual damascene by means of shallow dummy metal-line pattern.

2. Description of Related Art

In many high-integration semiconductor devices, there are more than two layers of interconnect metal layer, which are called multilevel interconnects for the purposes of forming wiring line structures. The process of multilevel interconnects usually provides a first or a lower layer structure of metal wiring and interconnect, then forms a second layer of metal wiring for connecting the first layer of metal wiring and interconnect. The first layer of metal wiring is polysilicon or metal layer and electrically connects to the drain/source of the device within the substrate.

As the sizes of the devices become smaller and smaller, the numbers of devices per unit area increase. As a result, the manufacture of low resist and high reliable interconnects to connect the devices is a significant problem for developing high quality integrated circuits in modern era.

At present, a method for forming metal interconnects, named dual damascene, provides a more stable and more progressive process to manufacture integrated circuits. Therefore, the dual damascene method has been widely applied to the VLSI process under 0.25 μm, which can form high efficient and high stable structure of metal interconnects.

Referring to FIGS. 1A through 1E, they show a conventional process for forming dual damascene. First, as shown in FIG. 1A, a first inter-metal dielectrics 104 is formed on a semiconductor substrate 100 containing a first metal line 102, and the material of the first inter-metal dielectric layer 104 is silicon oxide ($SiO_2$). Next, a stop layer 106, which is used to be an etch stop layer of a metal trench while etching the first inter-metal dielectric layer 104 thereafter, is formed on the first inter-metal dielectric layer 104 by means of chemical vapor deposition (CVD), and the material of the stop layer 106 is silicon nitride (SiNx) or similar matter. Next, a first photoresist pattern 108 of via hole is patterned on the stop layer 106, and then the stop layer 106 that is not protected by the first photoresist pattern 108 and the first inter-metal dielectric layer 104 are etched by anisotropic etching until a first opening 110 which is above the corresponding first metal line 102 is formed and the depth of the first opening is shallow.

Referring to FIG. 1B, after removing the first photoresist pattern 108, a second inter-metal dielectric layer 112 is formed on the whole stop layer 106 and filled inside the first opening 110. The material of the second inter-metal dielectric layer is the same as the first inter-metal dielectric layer 104, such as silicon oxide. Referring to FIG. 1C, a second photoresist pattern 114 is patterned on the second inter-metal dielectric layer 112, then the second inter-metal dielectric layer 112 that is not protected by the second photoresist pattern 114, the stop layer 106, and the first inter-metal dielectric layer 104 are etched by anisotropic etching. Therefore, a second metal-line trench 116 is formed through the first opening 110 so that the surface of the first metal-line 102 is exposed and a via hole 118 is formed. Besides, a number of third metal-line trench 120 are formed at one side of the second metal-line trench 116, and the area where these third metal-line trench 120 is so-called high integration region of metal-line trench 121. It should be noticed that the bottom of the second metal-line trench 116 and the top of the via hole 118 are communicated, and the stop layer 106 is exposed to the bottoms of the third metal-line trenches 120.

Referring to FIG. 1D, after removing the second photoresist pattern 114, a glue layer 122 is blanketed on the surface of the second inter-metal dielectric layer 112 and along the side walls and bottoms of the second metal-line trench 116, via hole 118 and the third metal-line trenches 120. The material of the glue layer 122 is titanium, titanium nitride, tantalum or tantalum nitride for providing a better glue ability between materials of adjacent layers, and also has the function of barrier to prevent spiking between the silicon surface of the semiconductor substrate 100 and conductor deposited thereafter. Next, a metal layer 124 is formed on the glue layer 122 and filled inside the second metal-line trench 116, the via hole 118 and the third metal-line trenches 120. With the help of chemical mechanical polishing (CMP), the surface of the metal layer 124 and the glue layer 122 where are higher than the second inter-metal dielectric layer 112 is plannarized as shown in FIG. 1E, and then the metal filled inside the second metal-line trench 116, the via hole 118, the third metal-line trench 120 forms the second metal line 116a, the via hole 118a for connecting the first metal line 102 and the second metal line 106a, and the third metal lines 120a.

After polishing the metal layer 124 higher than the second dielectric layer 112, the glue layer 122 is then polished. However, the material of glue layer 122 is different the metal layer 124 so that it is hard to remove. If the area of the glue layer exposed to be polished is large, it needs much time to remove the glue layer, which causes over polishing effect so that the erosion of the metal line or dielectric layer occurs, and therefore the thickness of the metal line is reduced. For a wider metal lines spacing, the erosion problem is not serious. When the line spacing become smaller, especially under 0.18 μm of modem technology, the erosion of the metal line causing by the over polishing becomes more serious. In addition to the thickness of the metal line being reduced, it also increases the resistance of the metal line and reduces the conductivity of the metal line.

As the forgoing description, another conventional method that uses dummy metal-line pattern is provided to prevent reducing the thickness and increasing the resistance of the metal line due to over polishing. FIGS. 2A to 2E show cross-sectional views for forming dual damascene by means of dummy metal-line pattern. Referring to FIG. 2A, a first inter-metal dielectric layer 204 and a stop layer are formed on a semiconductor substrate 200 containing a first metal line 202, wherein the first inter-metal dielectric layer 204 whose material is silicon oxide is formed on the substrate 200, and the stop layer 206 whose material is silicon nitride is formed on the first inter-metal dielectric layer 204. Next, a first photoresist pattern 208 of via hole is patterned on the stop layer 206, and then portion of the stop layer 206 and the first inter-metal dielectric layer 204 that are not protected by the first photoresist pattern 208 are etched with anisotropic etching.

Subsequently, as shown in FIG. 2B, after removing the first photoresist pattern 208, a second inter-metal dielectric layer 212 whose material is the same as the dielectric layer 204 such as silicon oxide is formed on the stop layer 206 and is filled inside the first opening 210. Afterwards, as shown in FIG. 2C, a second photoresist pattern 214 which includes a intensive metal-line region 221 and a dummy metal-line region 223 is patterned on the second inter-metal dielectric layer 212. Then, the second inter-metal dielectric layer 212 and the stop layer 206 that are not protected by the photoresist pattern 214 are etched until the stop layer 206 is etched slightly whereby a second metal-line trench 216 and via hole opening 218 above the first metal line 202, a number of third metal-line trenches 220 defined by the intensive metal-line region 221, and dummy metal-line trench 226 defined by the dummy metal-line region 223 are formed. Therefore, the bottom of the second metal-line trench 216 and the top of the via hole opening 218 are communicated and the surface of the first metal-line 202 is exposed to the bottom of the via hole opening 218. Besides, the third metal-line trenches 220 whose bottom are slightly below the surface of the stop layer 206 are located at one side of the second metal-line trench 216, and the dummy metal-line trenches 226 whose bottom are also slightly below the surface of the stop layer 206 are located at the other side of the second metal-line trench 216.

Referring to FIG. 2D, after removing the second photoresist pattern 214, a glue layer 222 whose material is titanium, titanium nitride, tantalum, or tantalum nitride for increasing the glue ability between different layers is blanketed on the surface of the second inter-metal dielectric layer 212 and along side walls of the second metal-line trench 216 and along the side walls and bottoms of the via hole 218, the third metal-line trenches 220 and the dummy metal-line trenches 226. In addition, the glue layer 222 also has the function serving as a barrier that prevents the spiking between the silicon surface of the substrate 200 and conductor deposited thereafter. Afterwards, a metal layer 224 is blanketed on the glue layer 222 and is filled inside the second metal-line trench 216, the via hole 218, the third metal-line trenches 220 and dummy metal-line trenches 226. Finally, as shown in FIG. 2E, with the help of chemical mechanical polishing (CMP), a portion of the glue layer 222 and metal layer 224 higher than the second inter-metal dielectric layer 212 is polished, and then a second metal line 216a, a via hole 218a, and a number of third metal lines 220a and dummy metal lines 226a are formed.

According to the forgoing description, because the dummy metal-line region 223a composing of number of dummy metal lines 226a decreases the area of the glue layer which has to be removed, the polishing time can be reduced. Therefore, the thickness of the metal line does not have to be reduced which increases the resistance of the metal line as compared with conventional method. However, the dummy metal lines 226a cause parasitic capacitances between conducting lines and reduce the operation speed of devices when current flows through the devices.

Conclusively, there are number of disadvantages of the conventional methods, which are described as following:

(1) Without the help of the dummy metal-line pattern to form a structure of dual damascene, the over polishing for metal line due to CMP causes the erosion of the metal line. Especially, if the width between metal lines is too narrow, the thickness of metal lines (2) With the help of the dummy metal-line pattern to form a structure of dual damascene, the thickness of the metal lines. However, if the device turns on, it will increase the parasitic capacitor between conducting lines, which decreases the operation speed of the device.

SUMMARY OF THE INVENTION

An object of this invention is to provide an improved method to form dual damascene structure using a dummy metal-line.

In order to achieve the object of this invention, a method for forming the dual damascene structure is realized by utilizing a shallow dummy metal-line, which avoids the over polishing of metal lines that will increase the resistance of metal lines, and the parasitic capacitor between conducting lines. First, a first inter-metal dielectric layer whose material can be silicon oxide is formed on a semiconductor substrate containing a first metal line, then a stop layer is deposited on the first inter-metal dielectric layer and a first photoresist pattern for defining a via hole is patterned on the stop layer. Next, the stop layer that is not protected by the first photoresist pattern is etched until the first inter-metal dielectric layer is exposed, and then a first opening corresponding to the first metal line and a number of dummy metal-line trenches located at one side of the first opening are formed. Then, a second inter-metal dielectric layer whose material is as same as the first inter-metal dielectric layer is deposited on the stop layer after removing the first photoresist pattern, and the first and second inter-metal dielectric layer can name as inter-metal dielectric layer.

Subsequently, etching the inter-metal dielectric layer to form a second metal-line trench, via hole opening and a number of third metal-line trenches wherein the second metal-line trench and the via hole opening are above the first metal line, and the bottom of the second metal-line trench and the top of the via hole opening communicate each other. The third metal-line trenches are located at one side of the second metal line opening and the bottom of the third metal-line trenches are exposed to the surface of the stop layer. Next, after removing the second photoresist pattern, a glue layer is blanketed on the surface of the inter-metal dielectric layer and along the side walls and the bottoms of the second metal-line trench, via hole opening, the third metal-line trenches and shallow metal-line grooves. Afterwards, a metal layer is deposited on the glue layer. With CMP method, the metal layer and the glue layer where are higher than the surface of the inter-metal dielectric layer are polished to form a second metal line, a via hole under the second metal line, third metal lines and shallow dummy metal lines. The shallow dummy metal lines can decrease the area of the glue layer that needs to be polished, therefore the polishing time can be reduced so that the over polishing of the third metal lines which decreases the thickness of the third metal lines will not happen. In addition, the shallow dummy metal lines do not raise the parasitic capacitor between conducting lines.

BRIEF DESCRIPTION OF THE DRAWINGS

While the specification concludes with the claims particularly pointing out and distinctly claiming the subject matter which is regarded as the invention, the objects and features of the invention and further objects, features and advantages thereof will be better understood from the following description made in connection with the accompanying awings in which:

DESCRIPTION OF THE PREFERRED EMBODIMENT

Figure 1A:
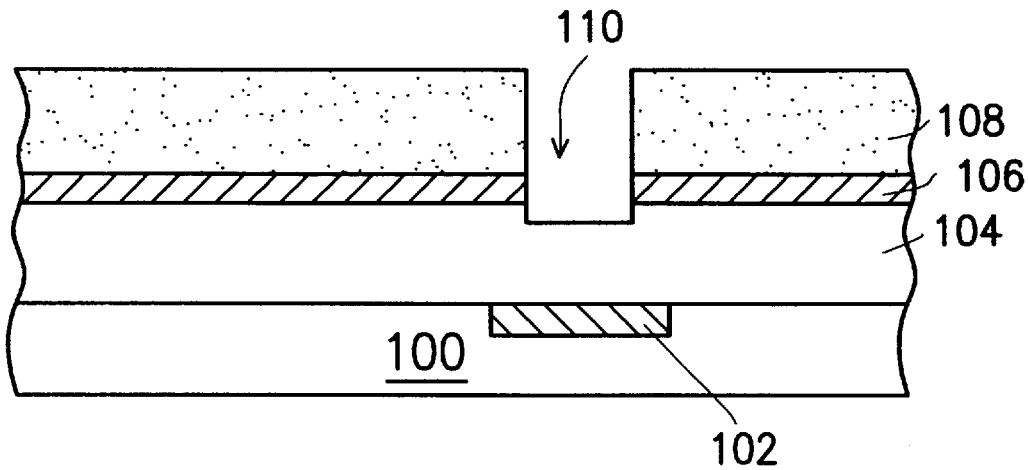
FIGS. 1A to 1E are cross-sectional views of a conventional method of forming dual damascene.
Figure 1B:
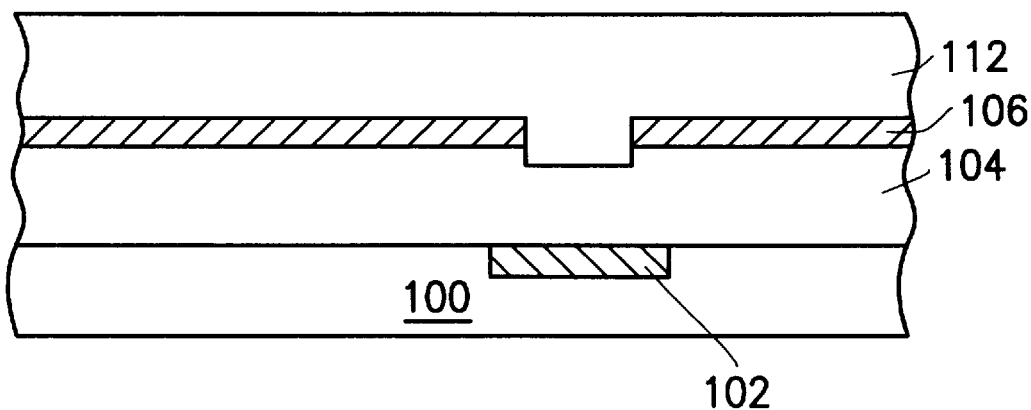
Figure 1C:
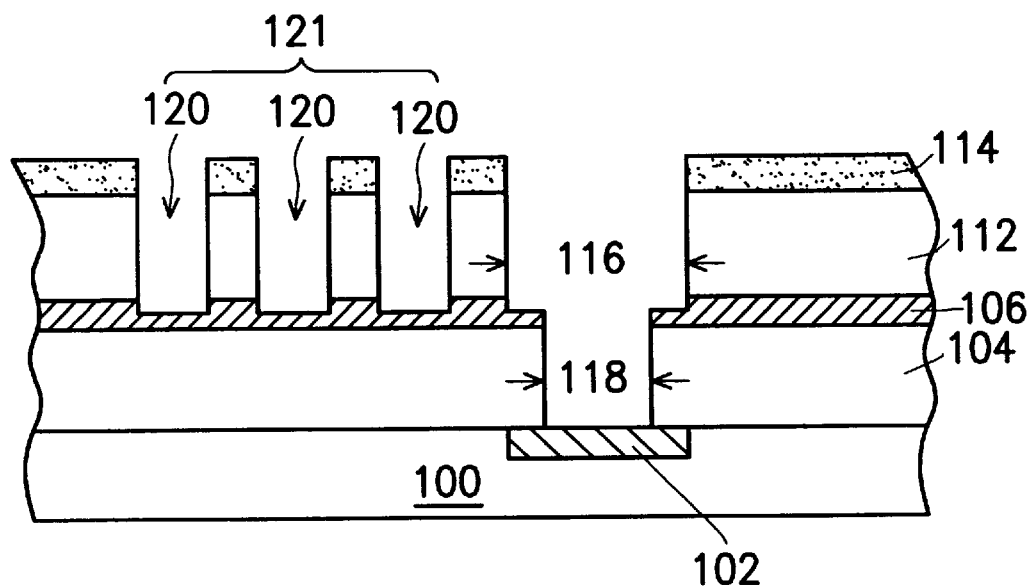
Figure 1D:
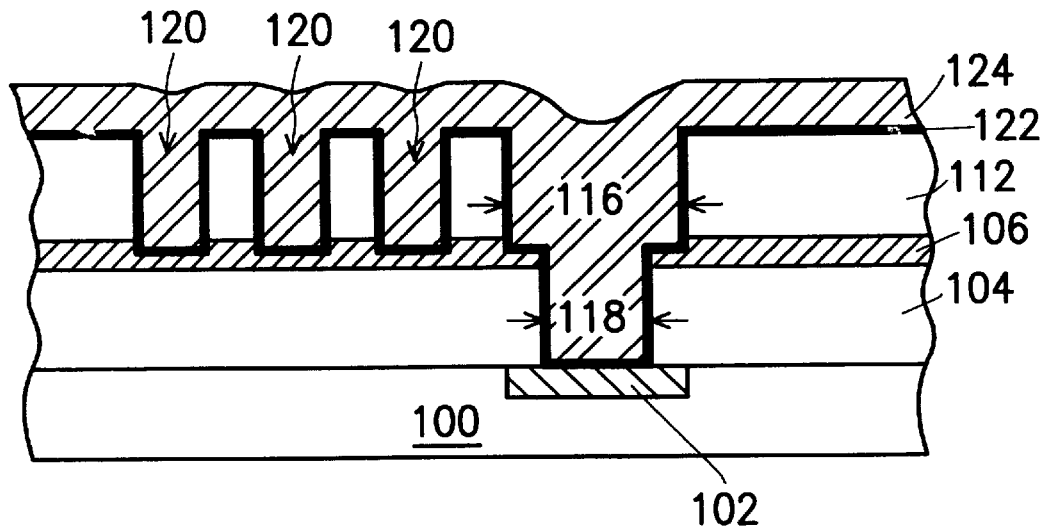
Figure 1E:
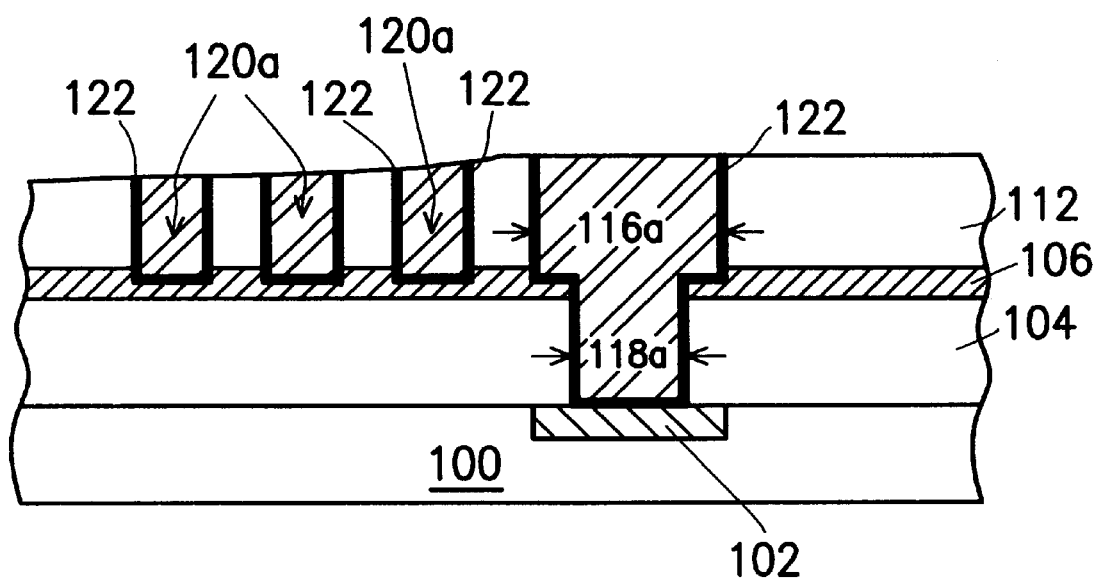
Figure 2A:
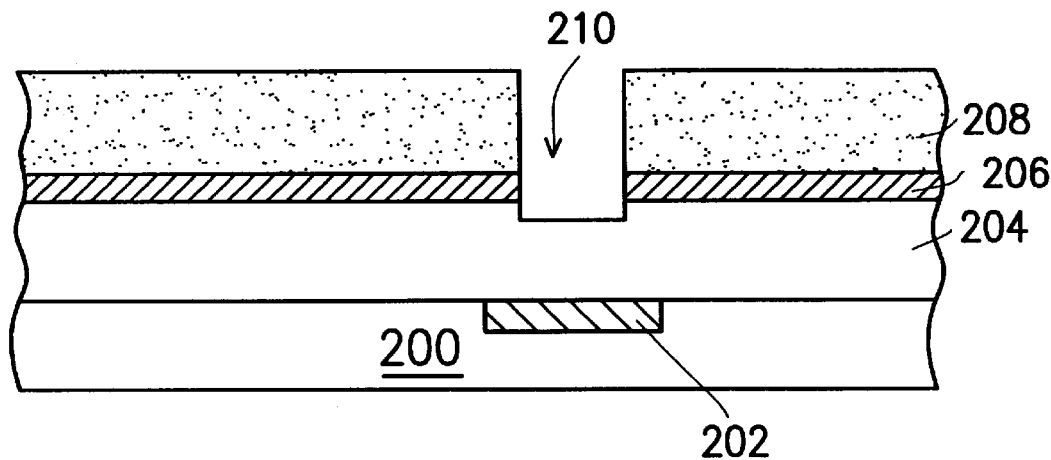
FIGS. 2A to 2E are cross-sectional views of another conventional method of forming dual damascene that uses dummy metal-line pattern.
Figure 2B:
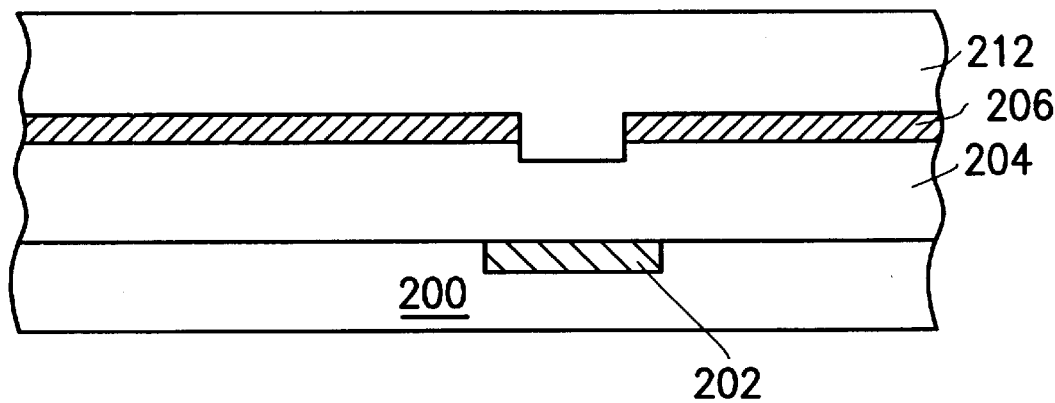
Figure 2C:
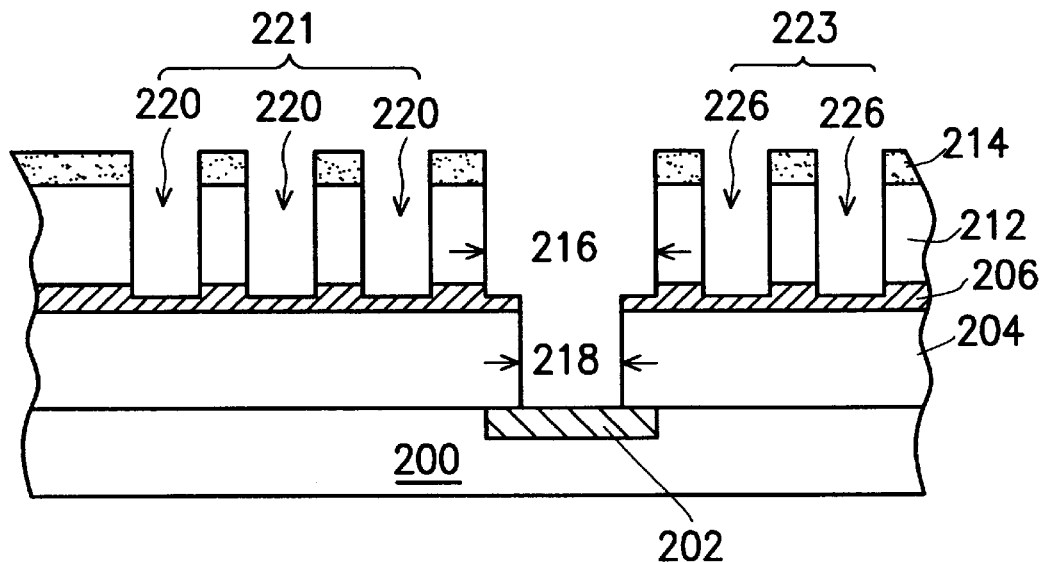
Figure 2D:
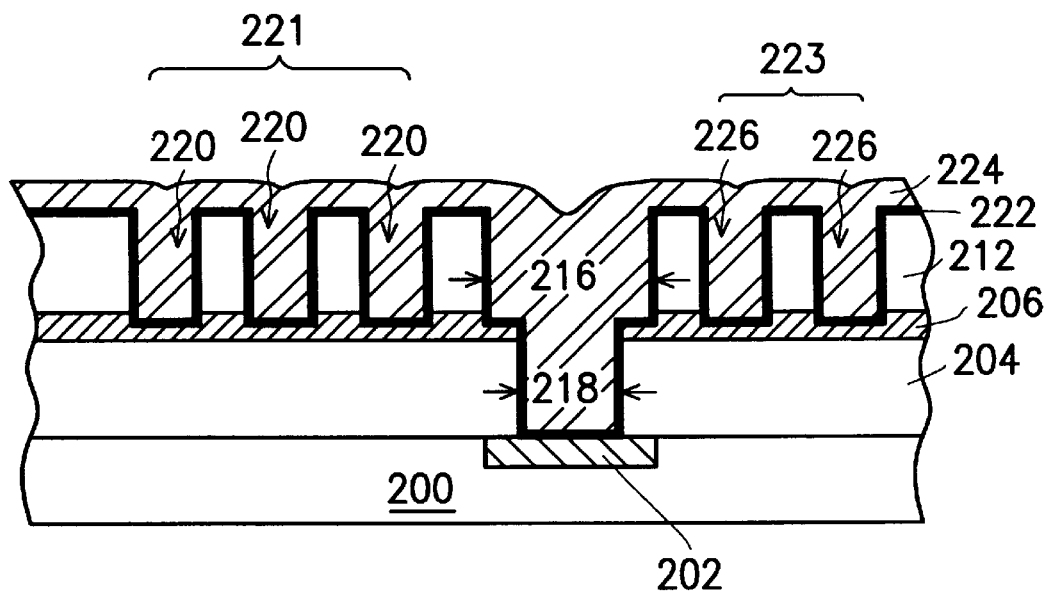
Figure 2E:
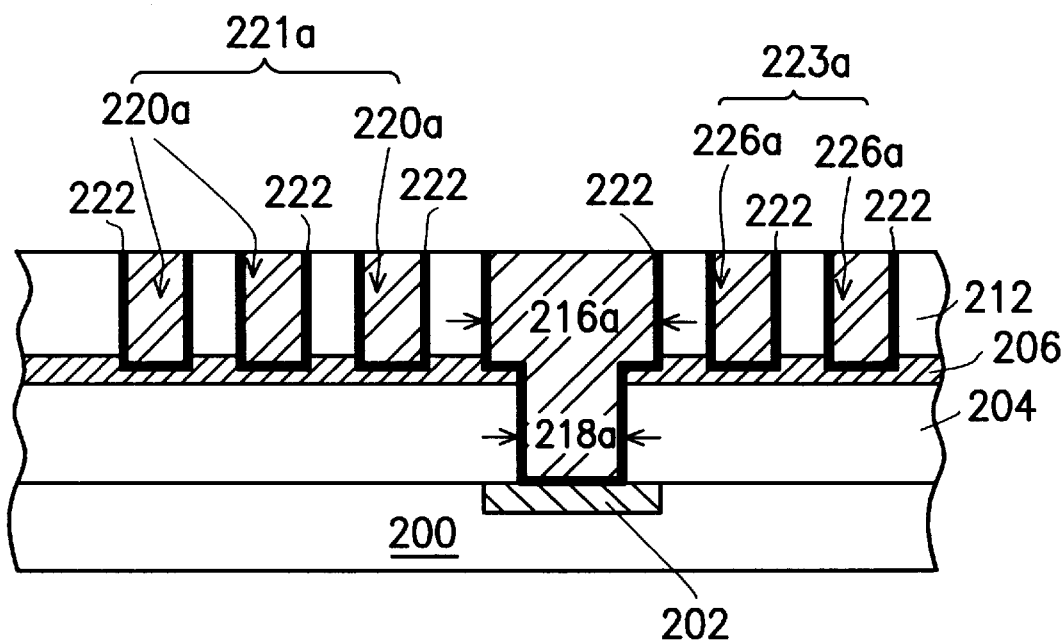
Figure 3A:
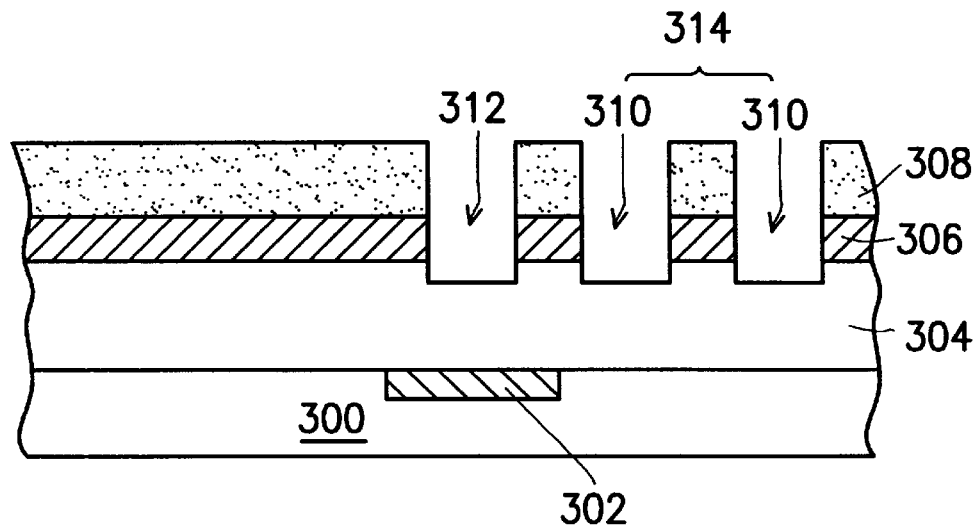
FIGS. 3A to 3E are cross-sectional views for forming dual damascene which uses shallow dummy metal-line pattern according to this invention.

FIGs. 3A to 3E show cross-sectional views for forming dual damascene by means of shallow dummy metal-line according to a preferred embodiment of this invention. Referring to FIG. 3A, a semiconductor substrate 300 including a first metal line 302 is provided and then a first inter-metal dielectric layer 304 whose material can be silicon oxide is formed on the whole substrate 300. Next, a stop layer 306 is deposited on the first inter-metal dielectric layer 304 and its thickness is about 1000Å to 1500 Å. Then, a first photoresist pattern 308 having dummy metal-line pattern 314 on it for patterning a via hole is patterned on the stop layer 306. Then, the stop layer 306 and first inter-metal dielectric layer 304 that are not protected by the first photoresist pattern 308 are etched by anisotropic dry etching until the first inter-metal dielectric layer 304 is etched lightly. Therefore, a first opening 312 is formed above the first metal line 302 and a number of second openings 310 are formed at one side of the first opening 312. The surface of the first inter-metal dielectric layer 304 is etched slightly and exposed to the bottoms of the first opening 312 and the second openings described above. Because a portion of stop layer 306 is etched away, the stress between the stop layer 306 and other layers is reduced.

Figure 3B:
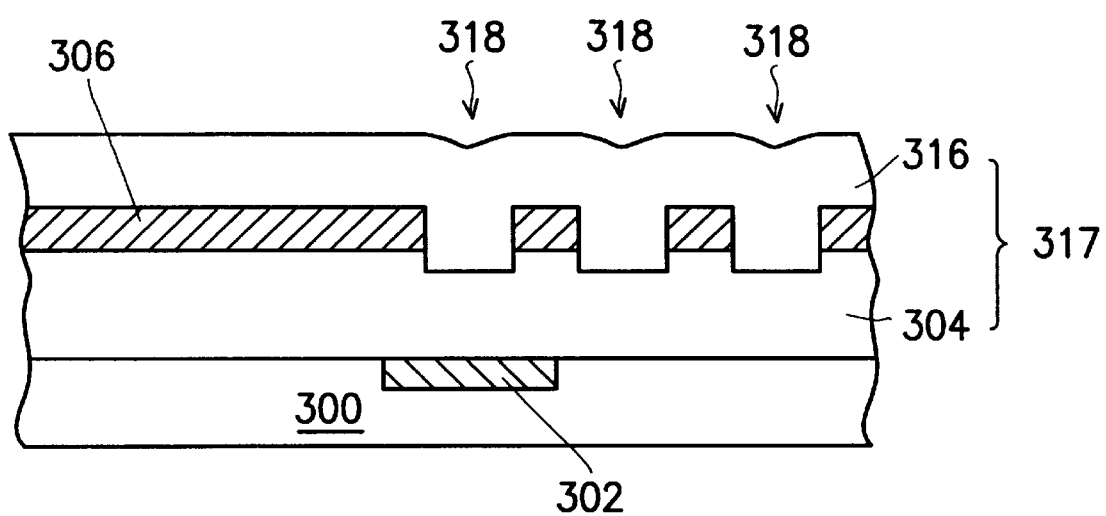

Next, as shown in FIG. 3B, after the first photoresist pattern 308 is removed, a second inter-metal dielectric layer 316 is formed on the stop layer 306 and filled inside the first opening 312 and a number of the second openings. Because the stop layer 306 has the first opening 312 and the second openings, the surficial topology of the second inter-metal dielectric layer 316 described above is rugged, and therefore a number of shallow dummy metal-line grooves are formed on the second inter-metal dielectric layer 316 and corresponding to the openings 310, 312 respectively. The material of the second inter-metal dielectric layer 316 is the same as the first inter-metal dielectric layer 304, such as silicon oxide or similar matter, so the first and second inter-metal dielectric layer can name as inter-metal dielectric layer 317.

Figure 3C:
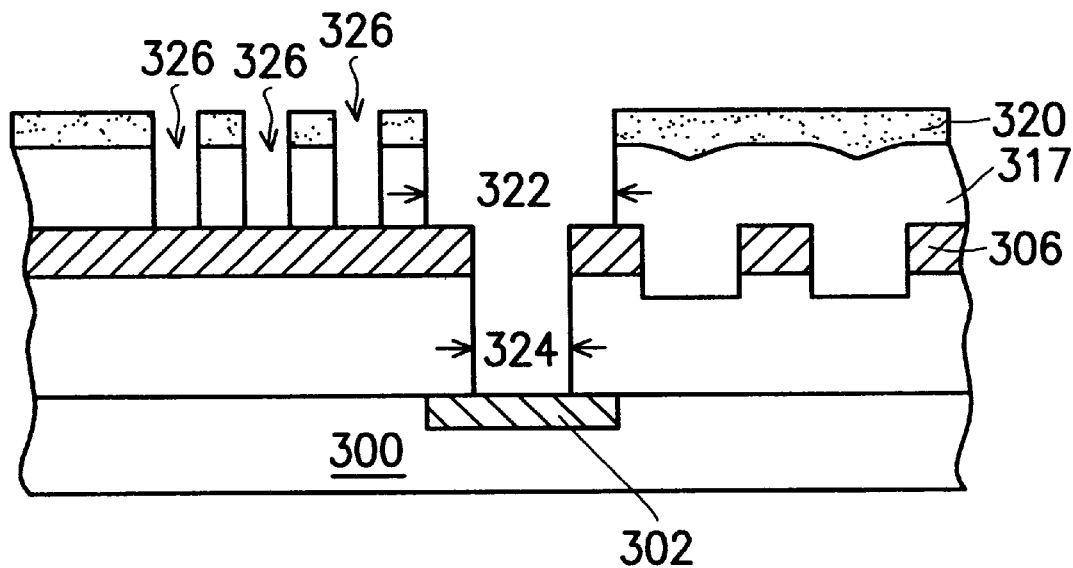

Then, as shown in FIG. 3C, a second photoresist pattern 320 is patterned on the inter-metal dielectric layer 317. Subsequently, the inter-metal dielectric layer 317 that is not protected by the second photoresist pattern 320 is etched by anisotropic etching, and then a second metal-line trench 322 corresponding to the first metal line, a via hole opening 324, and a number of third metal-line trenches 326 which are located at one side of the second metal-line trench 322 where no shallow dummy metal-line trenches 318 exist are formed respectively. In addition, the bottom of the second metal-line trench 322 and the top of the via hole opening 324 communicate each other, and the surface of the first metal line 302 is exposed to the bottom of the via hole opening 324 and the stop layer 306 is exposed to the bottoms of the third metal-line trenches 326.

Figure 3D:
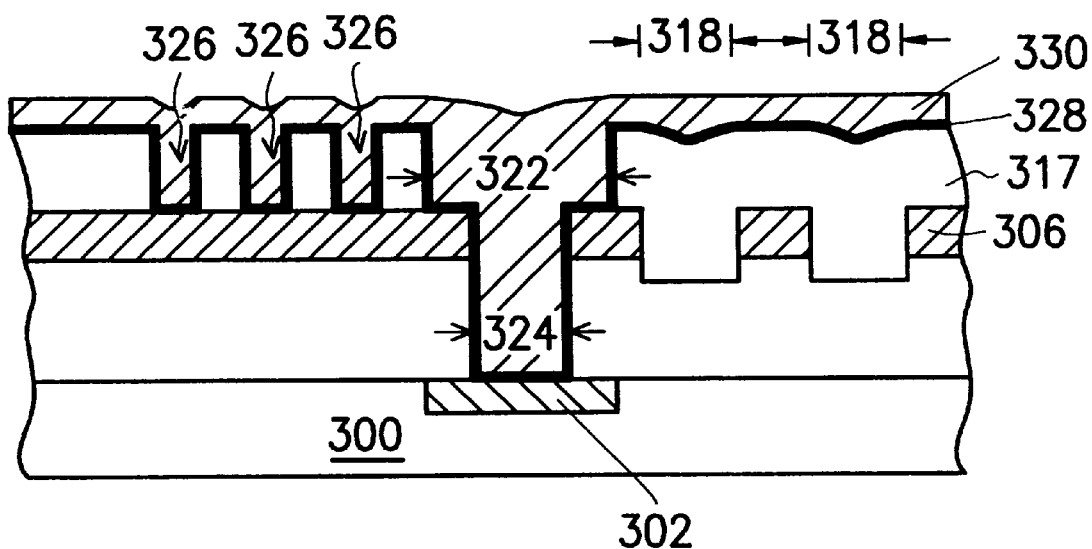

Referring to FIG. 3D, a thin glue layer 328 is formed along the side walls and the bottoms of the second metal-line trench 322, via hole opening 324, the third metal-line trenches 326 and on the surface of shallow dummy metal-line grooves and the inter-metal dielectric layer 317. The material of the glue layer 328 is titanium, titanium nitride, tantalum, or tantalum nitride and has thickness about 300 Å to 400 Å, which can increase the glue ability between two layers. Besides, the glue layer 328 also has the function of barrier, which prevents the spiking occurring at a junction between conductor that is deposited thereafter and the silicon substrate 300. Then, a metal layer 330 is deposited on the glue layer 320, and filled inside the second metal line trench 322, via hole 324, the third metal-line trench 326 and the shallow dummy metal-line grooves 318. At this moment, the surface of the metal layer 330 is rugged because the rugged surface and the openings of the inter-metal dielectric layer 317.

Figure 3E:
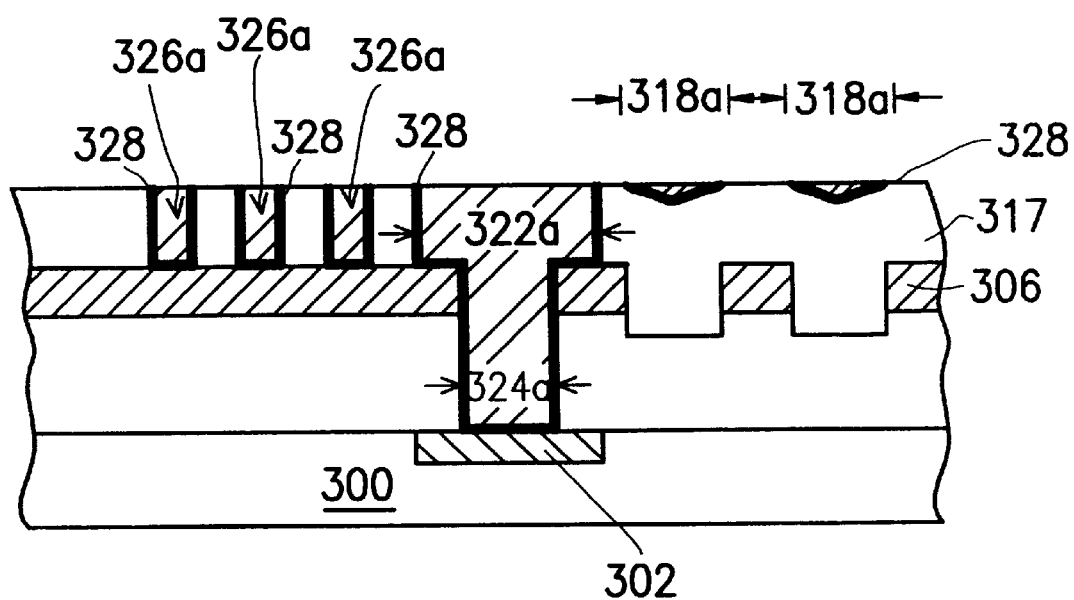

Next, as shown in FIG. 3E, the metal layer 330 and the glue layer 328 where are higher than the inter-metal dielectric layer 317 are polished with the help of chemical mechanical polishing (CMP) such that the metal layer 330 which is filled inside the second metal-line trench 322, the third metal-line trenches 326 and the shallow dummy metal-line grooves 318 have the same height as the inter-metal dielectric layer 317. Afterwards, a second metal line 322a, a via hole 324a under the second metal line 322a, third metal lines 326a, and shallow dummy metal lines 318a are formed. Because of the shallow dummy metal lines 318a, the area of glue layer that needs to be polished reduces and there is no over-polishing for metal lines that decreases the thickness and increases the resistance of metal lines as the conventional methods. In addition, the thickness of the shallow dummy metal lines is small and the parasitic capacitor produced by the shallow dummy metal lines is small so that the operation speed of the device will not be reduced.

According to the preferable embodiment described above, this invention has the following advantages:

(1) Because of the shallow dummy metal lines, the area of the glue layer that needs to be polished reduces, so the polishing time also reduces so that the thickness of metal lines do not be over polished.

(2) The depth of the dummy metal lines is shallow; therefore, when the device turns on, the parasitic capacitance due to the shallow dummy metal-line is low, and has minimal affect on the operational speed of the device.

(3) There is no additional step needed, which prevents increasing the manufacture cost.

(4) The stop layer under the shallow dummy metal lines is etched away, so that it reduces the inter-layer stress due to the stop layer which material is usually silicon nitride.

While the present invention has been described with a preferable embodiment, this description is not intended to limit our invention. Various modifications of the embodiment will be apparent to those skilled in the art. It is therefore contemplated that the appended claims will cover any such modifications or embodiments as fall within the true scope of the invention.

What is claimed is:

1. A method for forming dual damascene structure, which applies to a semiconductor substrate, the substrate at least including a first metal line inside the substrate, a first inter-metal dielectric layer on the substrate, and a stop layer on the first inter-metal dielectric layer, the method comprising:

patterning a first photoresist pattern for a via hole on the stop layer, wherein the first photoresist pattern includes a dummy metal line pattern;

forming a first opening and a second opening within the stop layer, wherein the first and the second openings expose the surface of the first inter-metal dielectric layer, the first opening is above the first metal line and the second opening is formed over the dummy metal line pattern and beside the first opening;

removing the first photoresist pattern;

forming a second inter-metal dielectric layer on the stop layer, wherein the second inter-metal dielectric layer is filled inside the first and the second openings and connects to the first inter-metal dielectric layer for forming a dummy metal-line trench inside the second inter-metal dielectric layer and above the second opening;

patterning a second photoresist pattern on the second inter-metal dielectric layer;

forming a second metal-line trench, a via hole opening and a third metal-line trench inside the second inter-metal dielectric layer, wherein the second metal-line trench is above the first metal line and communicates with the via hole opening, the surface of the first metal line is exposed to the bottom of the via hole opening, and the third metal-line trench is beside the second metal-line trench where no dummy metal-line trench exists;

removing the second photoresist;

forming a glue layer on the side walls and the bottom of the second metal-line trench, the third metal-line trench, the dummy metal-line trench and on the surface of the second inter-metal dielectric layer;

forming a metal layer on the glue layer and filled inside the via hole opening, the second metal-line trench, the third metal-line trench and the dummy metal-line trench; and polishing the portions of the metal layer and the glue layer that are formed on fop of the second inter-metal dielectric layer by means of chemical mechanical polishing to define a second metal line inside the second metal-line trench, a via inside the via hole opening, a third metal line inside the third metal-line trench and a dummy metal line inside the dummy metal-line trench wherein the dummy metal line is formed of portions of the metal layer that are not removed during chemical mechanical polishing.

2. The method of claim 1, wherein the first and the second inter-metal dielectric layers comprise silicon oxide.

3. The method of claim 1, wherein the stop layer comprises silicon nitride.

4. The method of claim 1, wherein the thickness of the stop layer is between about 1000Å to about 1500Å.

5. The method of claim 1, wherein the thickness of the glue layer is between about 300↑ to about 400↑.

6. The method of claim 1, wherein the glue layer functions as a barrier layer.

7. The method of claim 6, wherein the [material of the] glue layer [and the barrier layer are] comprises titanium nitride [respectively].

8. A method for forming dual damascene structure, which applies to a semiconductor substrate, the substrate at least including a first metal layer inside the substrate, a first inter-metal dielectric layer on the substrate, and a stop layer on the first inter-metal dielectric layer, the method comprising:

forming a first opening and a second opening within the stop layer, wherein the first opening is directly above the first metal layer and the second opening is formed beside the first opening;

forming a second inter-metal dielectric layer on the stop layer to fill inside the first opening and the second opening, wherein portions of the second inter-metal dielectric layer directly above the second opening are recessed;

forming a metal-line trench in the second inter-metal dielectric layer and further removing the first dielectric layer to form a via hole opening within the first opening to expose the first metal layer during the step of forming the metal-line trench, wherein the metal-line trench is formed in a portion of the second inter-metal dielectric layer that is adjacent to the first opening and in which no second openings have been formed;

forming a glue layer on the second inter-metal dielectric layer, the glue layer being conformal with the metal-line trench, the via hole opening, and the recessed portions of the second inter-metal dielectric layer;

forming a second metal layer on the glue layer, the second metal layer filling the inside of the via hole opening, the metal-line trench, and the recessed portions of the second inter-metal dielectric layer, wherein portions of the second metal line filling in the recessed portions of the second inter-metal dielectric layer form a dummy metal line; and polishing the second metal layer and the glue layer until a surface of the second inter-metal dielectric layer is exposed, wherein the portions of the glue layer inside the recessed portions of the second inter-metal dielectric layer are not removed.

* * * * *